United States Patent
Takahashi et al.

(10) Patent No.: US 12,113,308 B2
(45) Date of Patent: Oct. 8, 2024

(54) TERMINAL-EQUIPPED FLEXIBLE CIRCUIT BOARD AND CONNECTOR-EQUIPPED FLEXIBLE CIRCUIT BOARD

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Hideo Takahashi, Mie (JP); Yasuo Omori, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 435 days.

(21) Appl. No.: 17/615,980

(22) PCT Filed: Jun. 10, 2020

(86) PCT No.: PCT/JP2020/022799
§ 371 (c)(1),
(2) Date: Dec. 2, 2021

(87) PCT Pub. No.: WO2020/255812
PCT Pub. Date: Dec. 24, 2020

(65) Prior Publication Data
US 2022/0328993 A1 Oct. 13, 2022

(30) Foreign Application Priority Data
Jun. 18, 2019 (JP) .................................. 2019-112788

(51) Int. Cl.
*H01R 12/77* (2011.01)
*H01R 12/59* (2011.01)
(Continued)

(52) U.S. Cl.
CPC .......... *H01R 12/777* (2013.01); *H01R 12/59* (2013.01); *H05K 1/028* (2013.01); *H05K 1/118* (2013.01)

(58) Field of Classification Search
CPC .. H01R 12/78; H01R 12/79; H01R 12/59–69; H01R 12/777; H01R 12/778;
(Continued)

(56) References Cited

U.S. PATENT DOCUMENTS

2019/0199021 A1* 6/2019 Vittapalli .............. H01R 12/65

FOREIGN PATENT DOCUMENTS

DE      10 2010 062 885      6/2012
DE      102010062885 A1 *      6/2012 ........... B60R 16/027
(Continued)

OTHER PUBLICATIONS

International Search Report issued in International Bureau of WIPO Patent Application No. PCT/JP2020/022799, dated Aug. 18, 2020, along with an English translation thereof.

*Primary Examiner* — Abdullah A Riyami
*Assistant Examiner* — Amara Anderson
(74) *Attorney, Agent, or Firm* — Greenblum & Bernstein, P.L.C.

(57) ABSTRACT

Provided is a terminal-equipped flexible circuit board provided with a flexible circuit board that is flexible and a plurality of terminals. The flexible circuit board extends in a longitudinal direction, the flexible circuit board includes a plurality of conductive paths, the plurality of terminals each include a conductive path connection portion that is connected to a conductive path and a terminal connection
(Continued)

portion that extends in an extending direction from the conductive path connection portion and is connected to a partner terminal, the plurality of terminals are arranged on the flexible circuit board in a state in which the longitudinal direction of the flexible circuit board intersects the extending direction of the plurality of terminals, and the plurality of terminals are arranged in a plurality of levels in a state in which the flexible circuit board is folded.

5 Claims, 18 Drawing Sheets

(51) Int. Cl.
*H05K 1/02* (2006.01)
*H05K 1/11* (2006.01)

(58) Field of Classification Search
CPC ...... H01R 12/592; H05K 1/118; H05K 1/147; H05K 1/148; H05K 1/0277–028; H05K 2201/055; H05K 2201/10189; H05K 2201/10446; H05K 1/028; H05K 1/189
See application file for complete search history.

(56) References Cited

FOREIGN PATENT DOCUMENTS

| | | | | | |
|---|---|---|---|---|---|
| GB | 2034102 | A | * | 5/1980 | ............... H01B 7/06 |
| JP | 03-004465 | | | 1/1991 | |
| JP | 03004465 | A | * | 1/1991 | |
| JP | 2009-087833 | | | 4/2009 | |
| JP | 2009087833 | A | * | 4/2009 | |
| JP | 2013-020800 | | | 1/2013 | |
| JP | 2013020800 | A | * | 1/2013 | |

* cited by examiner

TERMINAL-EQUIPPED FLEXIBLE CIRCUIT BOARD AND CONNECTOR-EQUIPPED FLEXIBLE CIRCUIT BOARD

TECHNICAL FIELD

The present disclosure relates to a terminal-equipped flexible circuit board and a connector-equipped flexible circuit board.

BACKGROUND ART

Conventionally, a flat harness in which a connector is connected to a flexible circuit board that is flexible is known (JP 2013-20800A). This flat harness includes a flat circuit structure that is flexible and in which a plurality of conductive paths are formed, a plurality of terminal fittings that each include a conductive path joining portion that is joined to each conductive path of the circuit structure, and a connector housing provided with a plurality of terminal housing chambers that house the terminal fittings and are arranged side by side in the width direction of the circuit structure, in a plurality of levels.

CITATION LIST

Patent Documents

Patent Document 1: JP 2013-20800A

SUMMARY OF INVENTION

Technical Problem

In the conventional technique, a leading end of the flexible circuit board is branched into a comb-like shape. The terminal fittings are connected to the branched portions. Due to the branched portions being folded, the terminal fittings are arranged in a plurality of levels.

According to the above configuration, there is a problem in that, since the leading end of the flexible circuit board is branched into a comb-like shape, many portions are discarded when cutting out a plurality of flexible circuit boards from a single large base material into a predetermined shape, thus making it difficult to improve the yield of the flexible circuit board.

The present disclosure has been completed based on the circumstances as described above, and aims to provide a technique which improves the yield with respect to a terminal-equipped flexible circuit board and a connector-equipped flexible circuit board.

Solution to Problem

The present disclosure is a terminal-equipped flexible circuit board provided with a flexible circuit board that is flexible and a plurality of terminals, and the flexible circuit board extends in a longitudinal direction, the flexible circuit board includes a plurality of conductive paths, the plurality of terminals each include a conductive path connection portion that is connected to a conductive path among the plurality of conductive paths and a terminal connection portion that extends in an extending direction from the conductive path connection portion and is connected to a partner terminal, the plurality of terminals are arranged on the flexible circuit board in a state in which the longitudinal direction of the flexible circuit board intersects the extending direction of the plurality of terminals, and the plurality of terminals are arranged in a plurality of levels in a state in which the flexible circuit board is folded.

Advantageous Effects of Invention

According to the present disclosure, it is possible to improve the yield of a flexible circuit board.

DESCRIPTION OF EMBODIMENTS

Description of Embodiments of Disclosure

Figure 1:
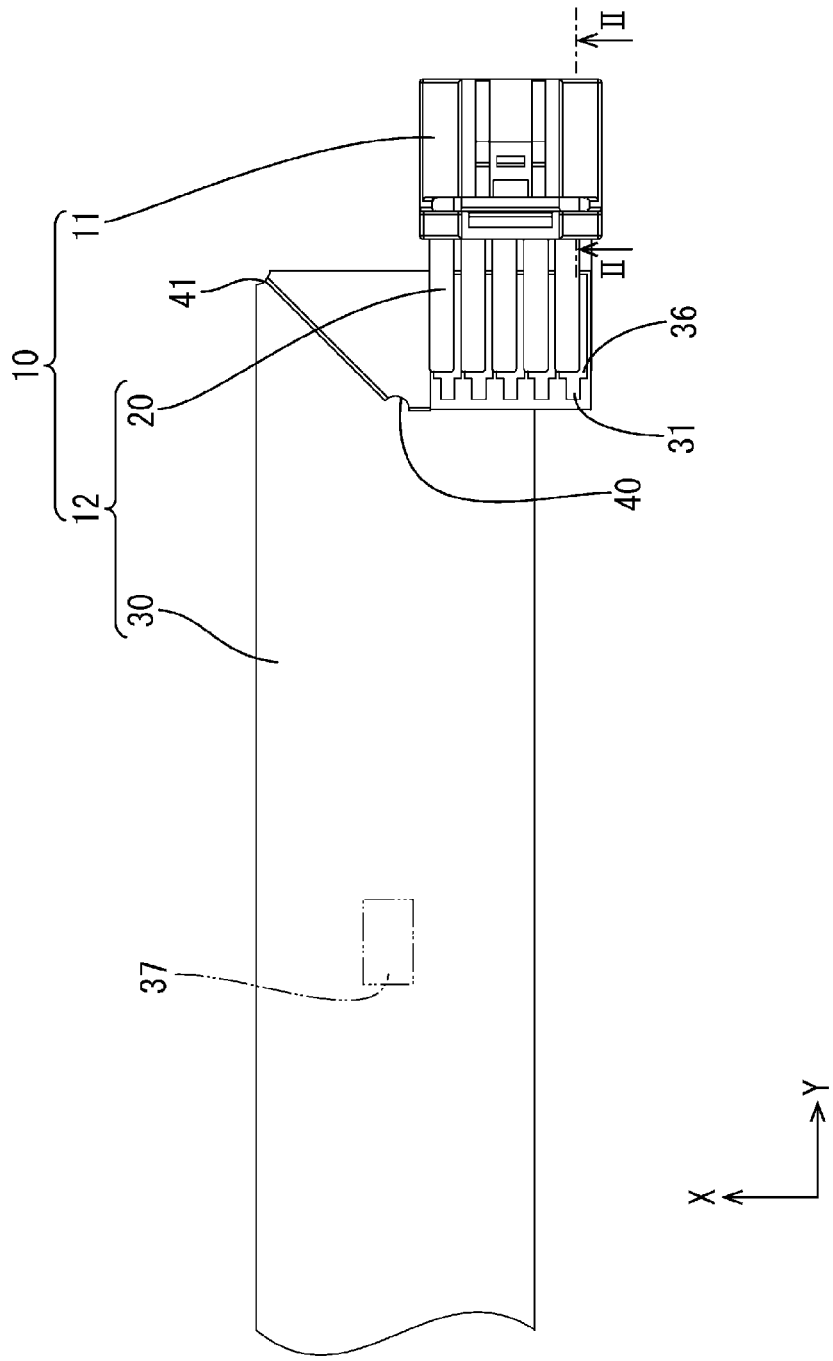
FIG. 1 is a plan view showing a connector-equipped flexible circuit board according to a first embodiment.

First, embodiments of the present disclosure will be listed and described.

(1) The present disclosure is a terminal-equipped flexible circuit board provided with a flexible circuit board that is flexible and a plurality of terminals, and the flexible circuit board extends in a longitudinal direction, the flexible circuit board includes a plurality of conductive paths, the plurality of terminals each include a conductive path connection portion that is connected to a conductive path among the plurality of conductive paths and a terminal connection portion that extends in an extending direction from the conductive path connection portion and is connected to a partner terminal, the plurality of terminals are arranged on the flexible circuit board in a state in which the longitudinal direction of the flexible circuit board intersects the extending direction of the plurality of terminals, and the plurality of terminals are arranged in a plurality of levels in a state in which the flexible circuit board is folded.

According to the above configuration, the plurality of terminals can be arranged in a plurality of levels without branching the flexible circuit board into the comb-like shape, and thus it is possible to improve the yield of the flexible circuit board.

(2) It is preferable that the plurality of terminals are arranged side by side at both side edges along the longitudinal direction of the flexible circuit board.

According to the above configuration, many terminals per unit length can be attached to the flexible circuit board in the longitudinal direction of the flexible circuit board, and thus the yield can be further improved.

(3) It is preferable that the plurality of terminals are arranged side by side at one side edge along the longitudinal direction of the flexible circuit board, a slit that extends along the extending direction from the one side edge of the flexible circuit board is formed in the one side edge, and the flexible circuit board is folded at a position corresponding to the slit.

The plurality of terminals arranged at the one side edge of the flexible circuit board can form a plurality of levels for each region divided by a cutout portion due to the flexible circuit board being folded at the position corresponding to the cutout portion. In this manner, the plurality of terminals can be easily arranged in three or more levels.

(4) It is preferable that the extending direction of the plurality of terminals and the longitudinal direction of the flexible circuit board are parallel with each other in a state in which the flexible circuit board is folded.

According to the above configuration, in the terminal-equipped flexible circuit board, the plurality of terminals extend in the longitudinal direction from the end portion of the flexible circuit board that extends in the longitudinal direction, and therefore the yield of the flexible circuit board can be improved.

(5) A connector equipped flexible circuit board according to the present disclosure includes the terminal-equipped flexible circuit board according to any one of aspects (1) to (4), and a connector housing including a plurality of cavities that are arranged in a plurality of levels and house the plurality of terminals.

Since the plurality of terminals are respectively housed in the cavities of the connector, the connector in which the terminals are arranged in the plurality of levels can be arranged at the end portion of the flexible circuit board. In this manner, the connector can be made narrow in width.

Description of Embodiments of Disclosure

Hereinafter, embodiments of the present disclosure will be described. The present invention is not limited to the embodiments disclosed herein, but is defined in the claims, and is intended to include all modifications within the meaning and the scope equivalent thereof.

First Embodiment

A first embodiment of the present disclosure will be described with reference to FIGS. 1 to 10. A connector-equipped flexible circuit board 10 in the present embodiment that is applied to a voltage detection line connected between a battery (not shown) and a control unit (not shown) is described as an example, and the connector-equipped flexible circuit board 10 includes a connector 11 and a terminal-equipped flexible circuit board 12. The terminal-equipped flexible circuit board 12 is provided with terminals 20 to be housed in the connector 11, and a flexible circuit board 30 on which conductive paths 31 that are joined to the terminals 20 are formed. In the description below, the direction indicated by an arrow Z is the upward direction, the direction indicated by the arrow Y is the frontward direction, and the direction indicated by an arrow X is the leftward direction. Also, in some cases, only some of a plurality of identical members are denoted by a reference sign and the reference sign is omitted for the other members.

Connector 11

Figure 2:
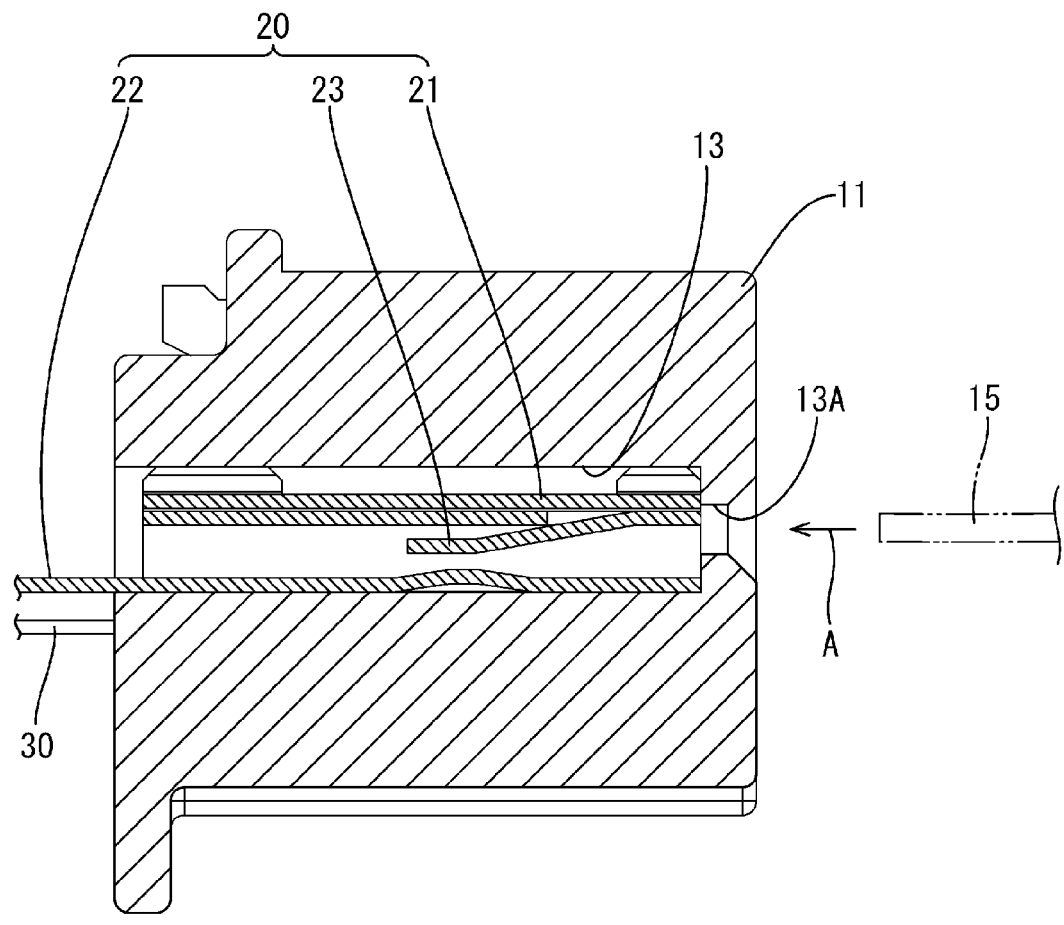
FIG. 2 is a cross-sectional view taken along line II-II in FIG. 1.

As shown in FIG. 1, the connector 11 has a substantially rectangular parallelepiped shape, and is formed by injection molding an insulating synthetic resin. As shown in FIG. 2, the connector 11 includes a plurality of cavities 13 which house the terminals 20. The cavities 13 extend through the connector 11 in the front-rear direction. Five cavities 13 are arranged side by side in parallel in the width direction in each of two vertical levels. The terminals 20 are respectively housed in the cavities 13. The front ends of the cavities 13 are insertion holes 13A in which a partner terminal 15 that is formed in a plate shape is inserted from the direction indicated by the arrow A. Although not shown in detail, the terminals 20 are held inside the cavities 13 using a known technique such as a lance or a retainer.

Terminal 20

As shown in FIG. 2, the terminals 20 are formed by pressing a metal plate material into a predetermined shape. Any metal such as copper, a copper alloy, aluminum, or an aluminum alloy can be selected as the metal forming the terminals 20 as appropriate. A plating layer such as tin or nickel may be formed on the surface of the terminals 20.

Each terminal 20 includes a conductive path connection portion 22 that is connected to a conductive path 31 of the flexible circuit board 30 and a terminal connection portion 21 that extends from the conductive path connection portion 22. The terminal connection portion 21 has a rectangular tubular shape in which the partner terminal 15 (not shown) can be inserted.

A plate-like elastic piece 23 that is electrically connected to the partner terminal 15 by elastically coming into contact with the partner terminal 15 extends rearward inside the terminal connection portion 21. The conductive path connection portion 22 is overlaid on and joined to each of lands 36 (described later) of the flexible circuit board 30. The lands 36 are continuous with the conductive paths 31 and form portions of the conductive paths 31.

Flexible Circuit Board 30

As shown in FIG. 1, the flexible circuit board 30 is guided rearward from a rear end of the connector 11. Although not shown in detail, the conductive paths 31 are formed along the guiding direction on the flexible circuit board 30. Due to these conductive paths 31, the flexible circuit board 30 has the function of a voltage detection line that connects a battery (not shown) and a control unit that controls the battery.

The flexible circuit board 30 according to the present embodiment is a flexible printed circuit board (FPC). In the flexible circuit board 30, conductive paths 31 formed by a copper conductive film are formed on an upper surface or a lower surface of a support circuit board formed by an insulating film, and the conductive paths 31 are covered by a protective film. An electronic component 37 is mounted on the flexible circuit board 30. Although not specifically shown in the drawings, the electronic component 37 is connected to the conductive paths 31. The electronic component 37 is not particularly limited, and any electronic component 37 such as a resistor, a capacitor, a transistor, or a microcomputer can be selected as appropriate (see FIG. 1).

Figure 3:
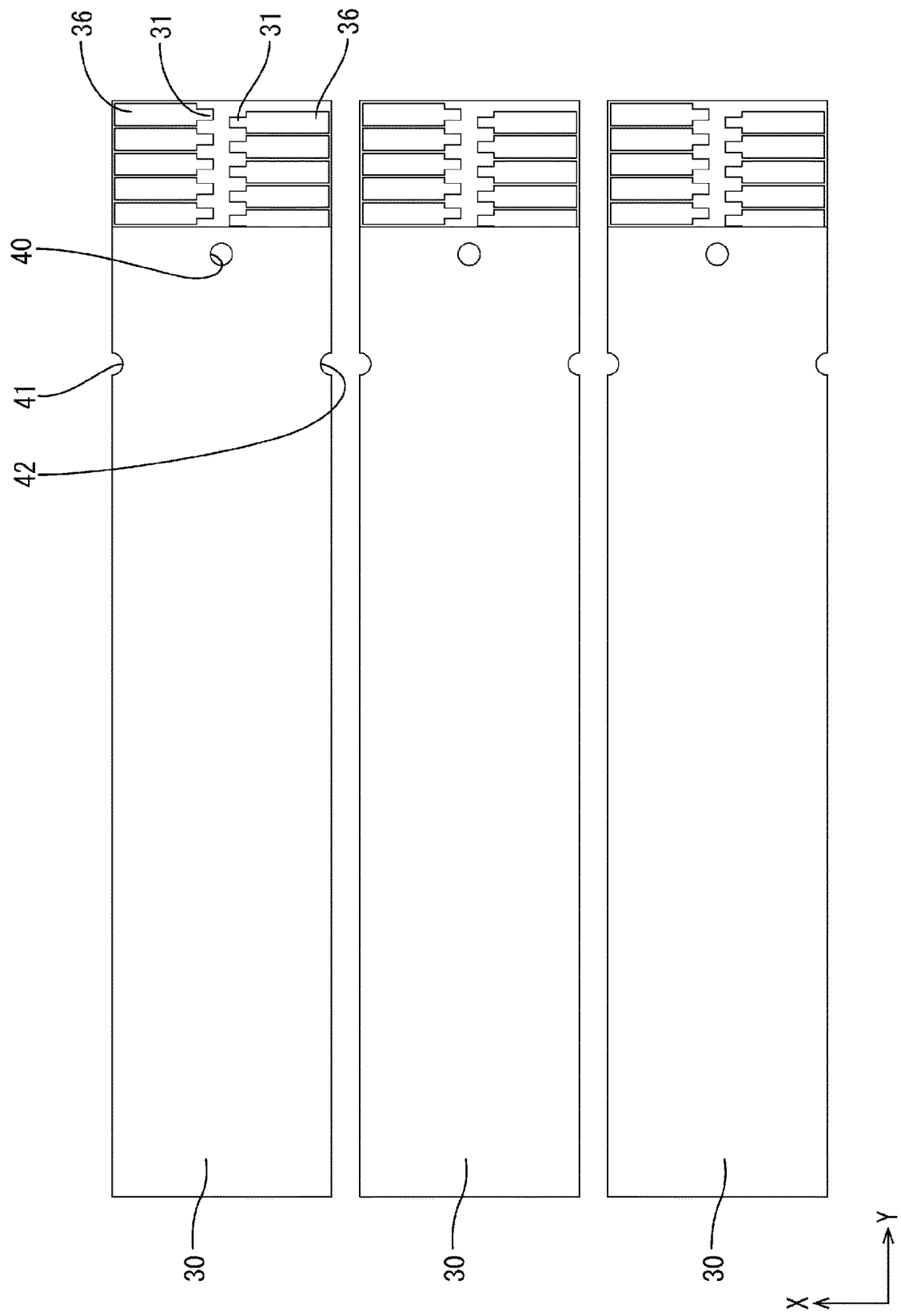
FIG. 3 is a plan view showing the flexible circuit boards.

As shown in FIG. 3, the flexible circuit board 30 has a band-like shape that extends in the front-rear direction (an example of the longitudinal direction). A plurality (ten in the present embodiment) of lands 36 are formed at the front end portion of the flexible circuit board 30. Five lands 36 are arranged side by side in the front-rear direction at a left side edge of the flexible circuit board 30, and the other five lands 36 are arranged side by side in the front-rear direction at a right side edge of the flexible circuit board 30. The lands 36 each have a substantially rectangular shape that is elongated in the left-right direction. The end portions of the lands 36 on the inner side in the left-right direction of the flexible circuit board 30 are connected to the conductive paths 31 formed on the flexible circuit board 30. Note that only the vicinity of a portion at which the conductive paths 31 are connected to the lands 36 is shown in the drawings, and other portions are omitted.

Figure 4:
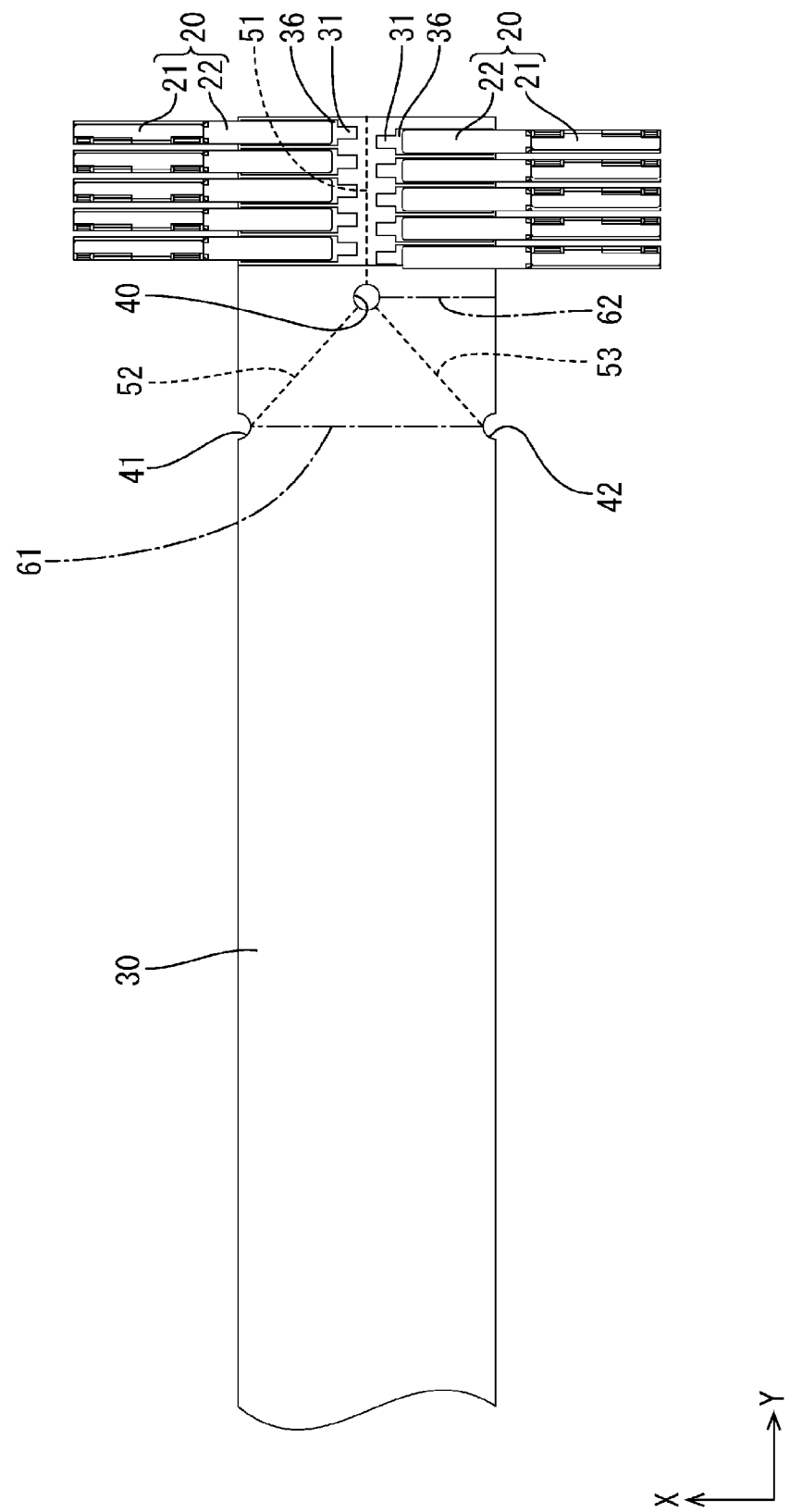
FIG. 4 is a plan view showing a state in which terminals are connected to the flexible circuit board.

FIG. 4 shows a state in which the conductive path connection portions 22 of the terminals 20 are connected to the lands 36. The terminal connection portions 21 of the terminals 20 connected to the left side edge of the flexible circuit board 30 protrude leftward (an example of the extending direction) from the left side edge of the flexible circuit board 30, and the terminal connection portions 21 of the terminals 20 connected to the right side edge of the flexible circuit board 30 protrude rightward (an example of the extending direction) from the right side edge of the flexible circuit board 30.

A through hole 40 that extends through the flexible circuit board 30 in the up-down direction is formed at a position that is slightly rearward of a region in which the lands 36 are formed and that is near the center in the left-right direction of the flexible circuit board 30. The through hole 40 has a circular shape as seen from above.

A left recessed portion 41 and a right recessed portion 42 that each have a semicircular shape are respectively formed at positions on the left and right side edges of the flexible circuit board 30 that are slightly rearward of the through hole 40. The left recessed portion 41 formed at the left side edge of the flexible circuit board 30 and the right recessed portion 42 formed at the right side edge of the flexible circuit board 30 are respectively formed at positions located rearward of the front end portion of the flexible circuit board 30 by the same length.

Folding Structure of Flexible Circuit Board 30

Figure 5:
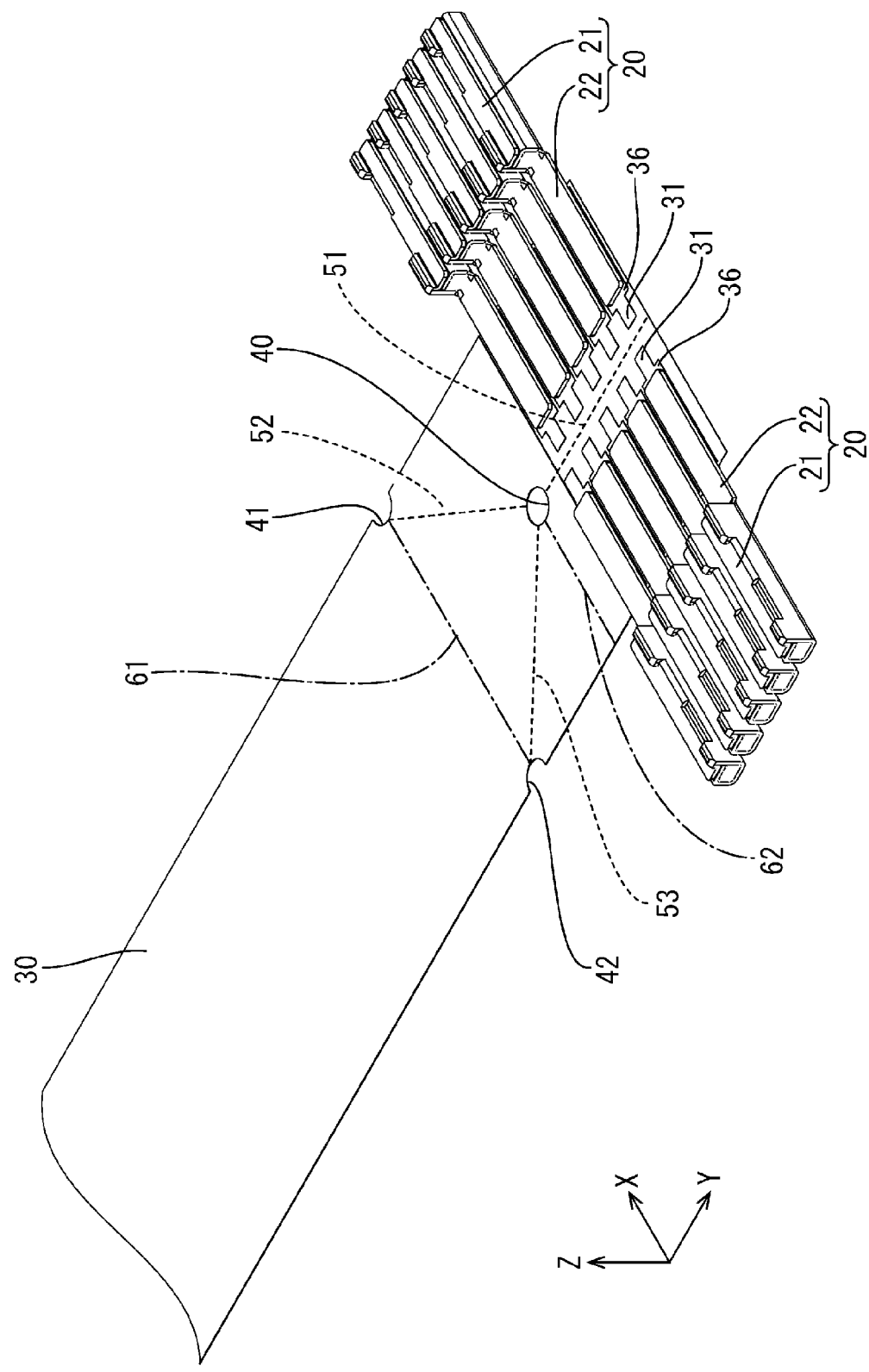
FIG. 5 is a perspective view showing a state in which the terminals are connected to the flexible circuit board.

FIGS. 4 and 5 show the flexible circuit board 30 to which the terminals 20 are connected in the state before the flexible circuit board 30 is folded. In FIGS. 4 and 5, mountain fold lines are indicated by broken lines, and valley fold lines are indicated by dot-and-dash lines. The mountain fold lines are fold lines along which the upper surface of the flexible circuit board 30 is folded into a protruding shape, and the valley fold lines are fold lines along which the upper surface of the flexible circuit board 30 is folded into a recessed shape.

A first mountain fold line 51 that extends frontward from the through hole 40, a second mountain fold line 52 that extends from the through hole 40 toward the left recessed portion 41, and a third mountain fold line 53 that extends from the through hole 40 toward the right recessed portion 42 are provided on the flexible circuit board 30. Also, a first valley fold line 61 that extends from the left recessed portion 41 toward the right recessed portion 42, and a second valley fold line 62 that extends from the through hole 40 to the right side edge of the flexible circuit board 30 are provided on the flexible circuit board 30. The through hole 40, the left recessed portion 41, and the right recessed portion 42 facilitate folding of the flexible circuit board 30 along the first mountain fold line 51, the second mountain fold line 52, the third mountain fold line 53, the first valley fold line 61, and the second valley fold line 62.

Figure 6:
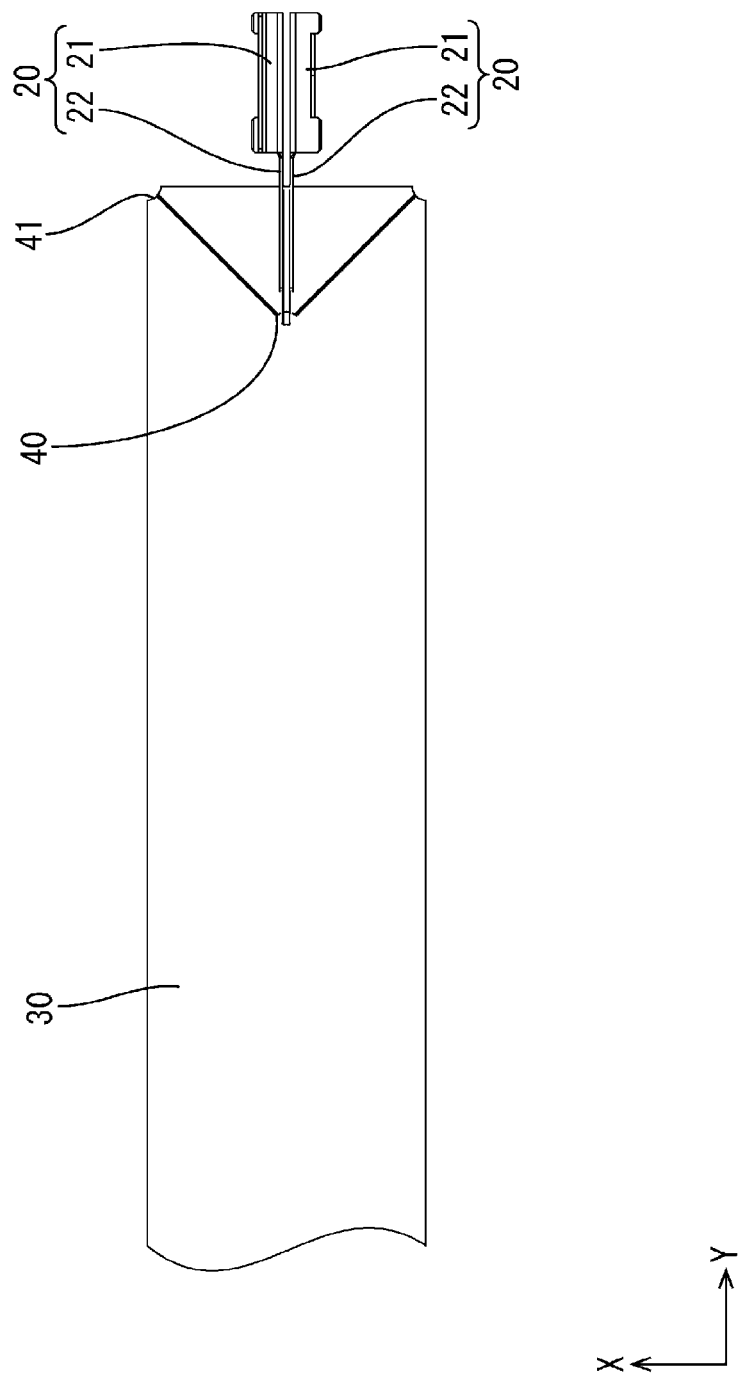
FIG. 6 is a plan view showing a state in which the flexible circuit board is folded along a first mountain fold line, a second mountain fold line, a third mountain fold line, and a first valley fold line.
Figure 7:
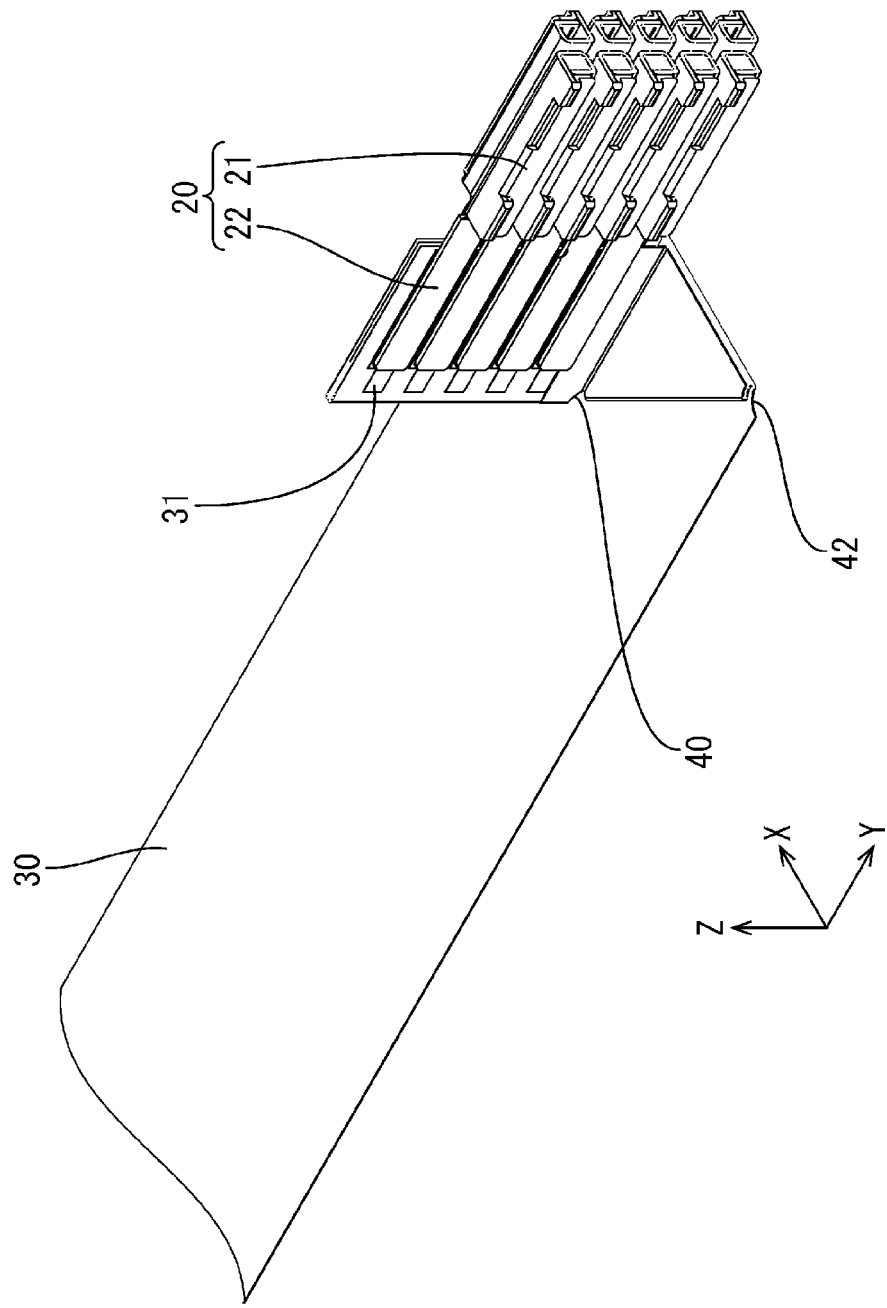
FIG. 7 is a perspective view showing a state in which the flexible circuit board is folded along the first mountain fold line, the second mountain fold line, the third mountain fold line, and the first valley fold line.

FIGS. 6 and 7 show the flexible circuit board 30 that is mountain-folded along the first mountain fold line 51, the second mountain fold line 52, and the third mountain fold line 53, and valley-folded along the first valley fold line 61. In this state, portions of the flexible circuit board 30 at which the terminals 20 are arranged overlap each other in the left-right direction and stand upright. Also, the terminal connection portions 21 of the terminals 20 arranged at the left side edge and the terminal connection portions 21 of the terminals 20 arranged at the right side edge extend frontward.

Figure 8:
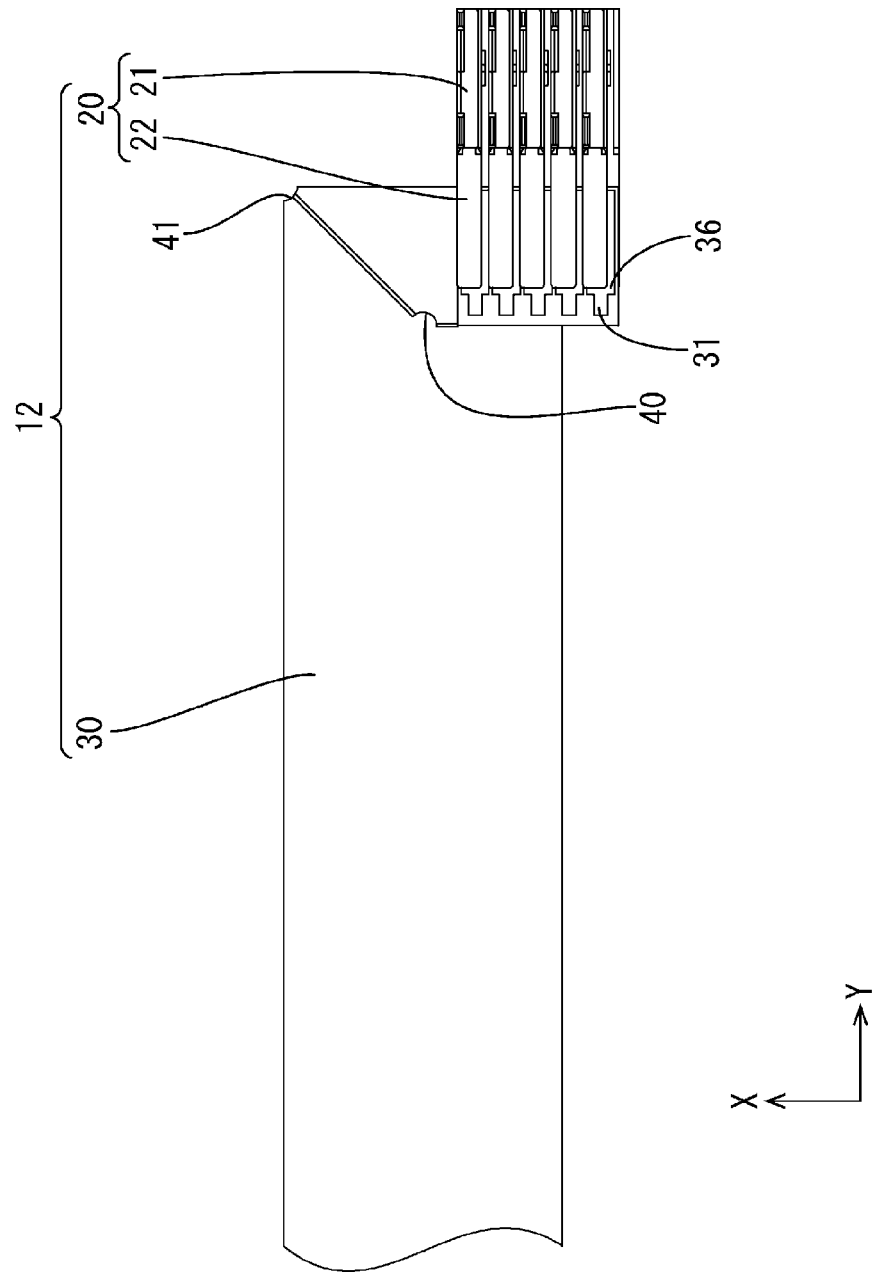
FIG. 8 is a plan view showing a state in which the flexible circuit board is further folded along a second valley fold line.
Figure 9:
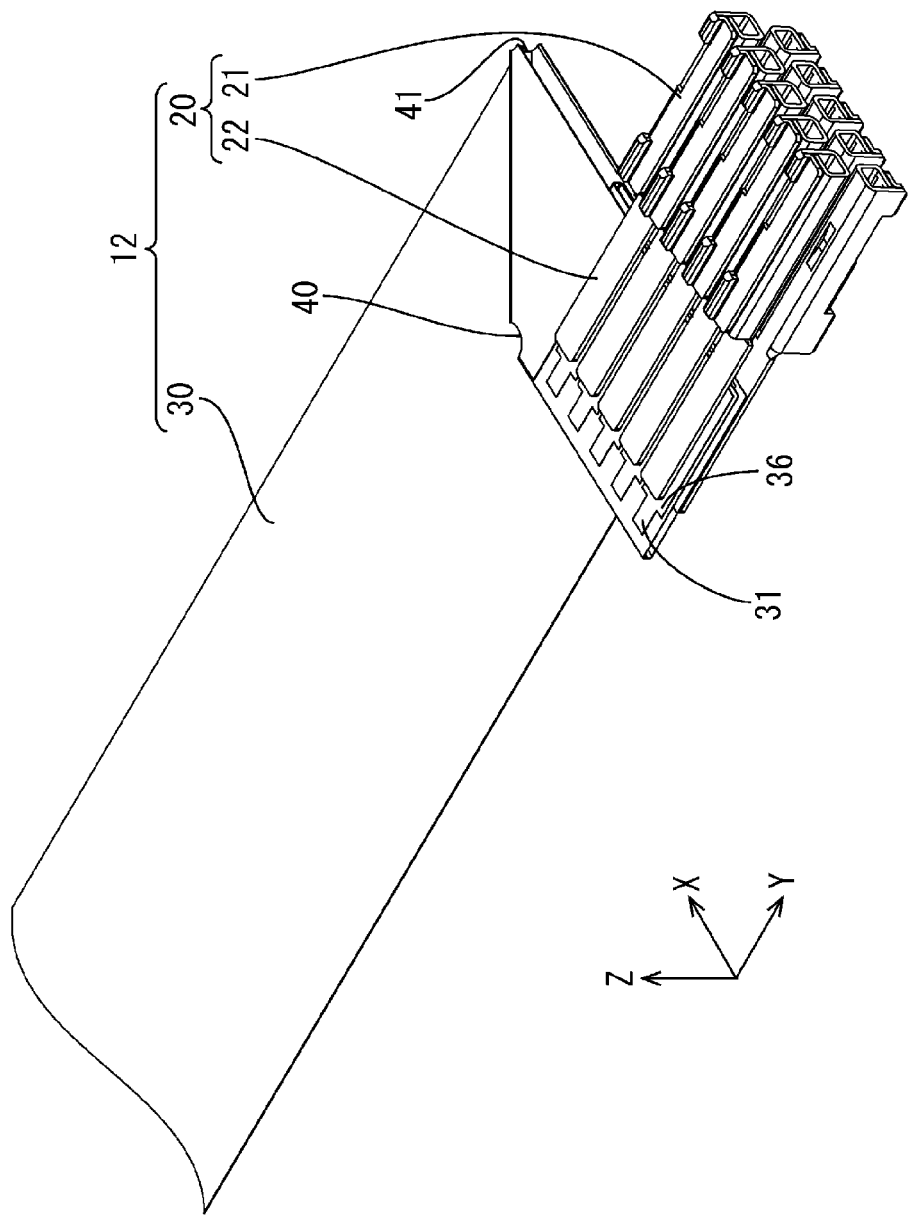
FIG. 9 is a perspective view showing a state in which the flexible circuit board is further folded along the second valley fold line.

FIGS. 8 and 9 show a state in which the flexible circuit board 30 is further valley-folded along the second valley fold line 62. In this state, portions of the flexible circuit board 30 at which the terminals 20 are arranged overlap with the flexible circuit board 30 in the up-down direction. Also, the terminal connection portions 21 of the terminals 20 arranged at the left side edge and the terminal connection portions 21 of the terminals 20 arranged at the right side edge extend frontward while being arranged in two vertical levels. As shown in FIGS. 8 and 9, in the state where the flexible circuit board 30 is folded, the terminal connection portions 21 of the terminals 20 extend frontward (an example of the extending direction) from the conductive path connection portions 22. In this manner, the direction in which the flexible circuit board 30 extends (front-rear direction) and the direction in which the terminal connection portions 21 of the terminals 20 extend (frontward) are parallel with each other.

Manufacturing Steps of Embodiment

Next, an example of manufacturing steps of the present embodiment will be described. Note that the manufacturing steps of the present embodiment are not limited to the description below.

Next, the method for assembling the connector-equipped flexible circuit board 10 of the present embodiment will be described. First, the terminals 20 are joined to the lands 36 of the flexible circuit board 30 in a flat state shown in FIG. 3. Specifically, the terminal connection portions 21 of the terminals 20 are respectively joined to the lands 36 through reflow soldering. Also, the electronic component 37 is soldered to the conductive paths 31. Next, as shown in FIGS. 6 and 7, the flexible circuit board 30 is mountain-folded along the first mountain fold line 51, the second mountain fold line 52, and the third mountain fold line 53, and the flexible circuit board 30 is valley-folded along the first valley fold line 61. Next, as shown in FIGS. 8 and 9, the flexible circuit board 30 is valley-folded along the second valley fold line 62. In this manner, the terminal-equipped flexible circuit board 12 is completed.

Figure 10:
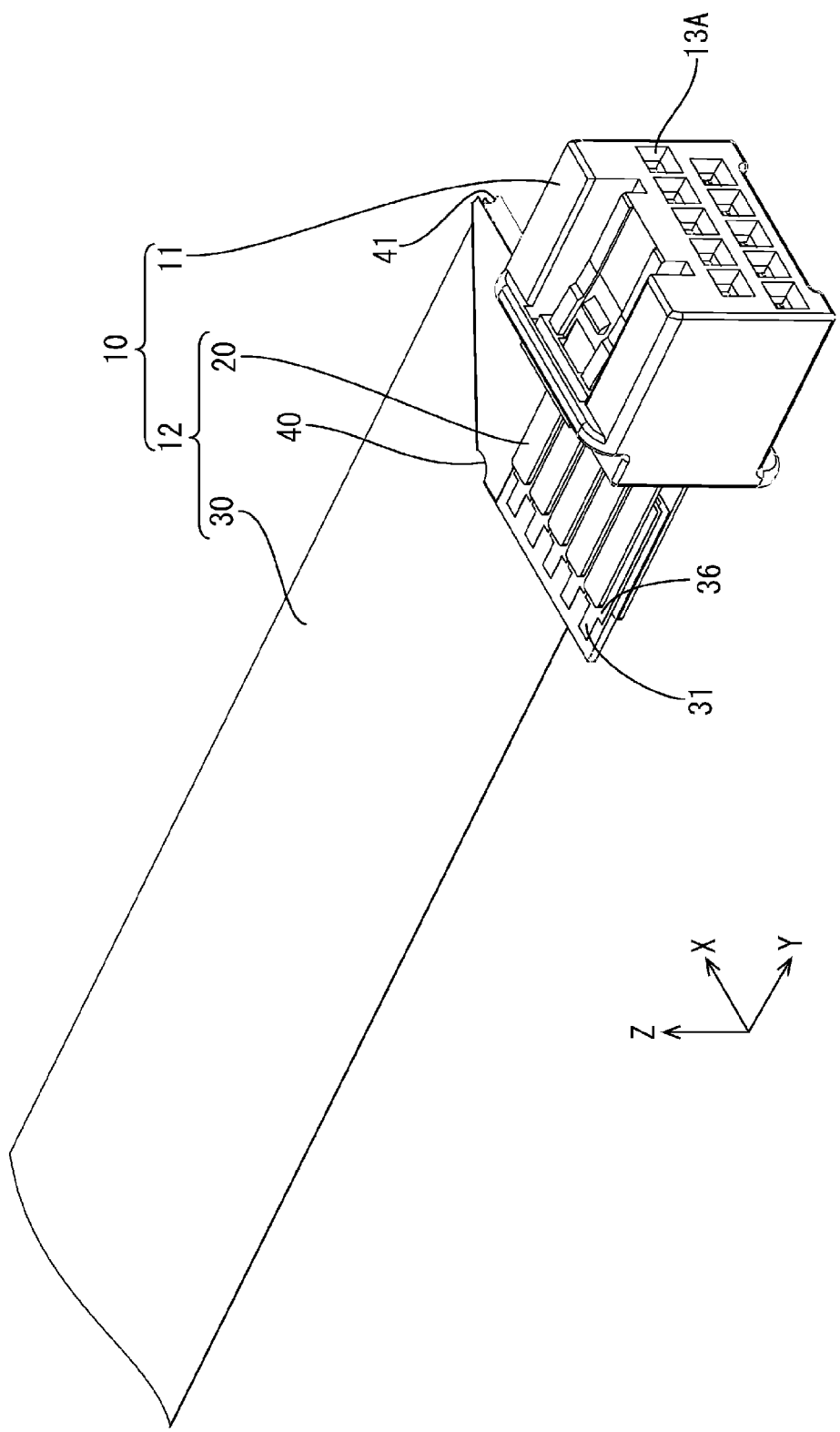
FIG. 10 is a perspective view showing a state in which terminal connection portions of the terminals are housed in cavities of a connector.

Next, the terminal connection portions 21 of the terminals 20 are respectively inserted from the rear side into the cavities 13 of the connector 11. In this manner, as shown in FIG. 10, the connector-equipped flexible circuit board 10 is completed.

Operation and Effects of Embodiment

Next, operation and effects of the present embodiment will be described. The present embodiment is a terminal-equipped flexible circuit board 12 provided with a flexible circuit board 30 that is flexible and a plurality of terminals 20, and the flexible circuit board 30 extends in a longitudinal direction, the flexible circuit board 30 includes a plurality of conductive paths 31, the plurality of terminals 20 each include a conductive path connection portion 22 that is connected to a conductive path 31 among the plurality of conductive paths 31 and a terminal connection portion 21 that extends in an extending direction from the conductive path connection portion 22 and is connected to a partner terminal 15, the plurality of terminals 20 are arranged on the flexible circuit board 30 in a state in which the longitudinal direction (front-rear direction) of the flexible circuit board 30 intersects the extending direction (leftward and rightward) of the plurality of terminals 20, and the plurality of terminals 20 are arranged in a plurality of levels in a state in which the flexible circuit board 30 is folded.

As shown in FIG. 3, the flexible circuit board 30 according to the present embodiment does not branch into the comb-like shape protruding in the left-right direction. In other words, the flexible circuit board 30 according to the present embodiment is formed to have a constant width with respect to the left-right direction. In this manner, the plurality of terminals 20 can be arranged in a plurality of levels without the flexible circuit board 30 being branched into the comb-like shape, and thus the yield of the flexible circuit board 30 can be improved in the case in which a plurality of flexible circuit boards 30 are cut out from a single base material.

Also, according to the present embodiment, the plurality of terminals 20 are arranged side by side at the two side edges along the longitudinal direction (front-rear direction) of the flexible circuit board 30. In this manner, since many terminals 20 per unit length can be attached to the flexible circuit board 30 with respect to the longitudinal direction (front-rear direction) of the flexible circuit board 30, the yield can be further improved.

Also, according to the present embodiment, in the state in which the flexible circuit board 30 is folded, the extending direction (frontward) of the plurality of terminals 20 and the longitudinal direction (front-rear direction) of the flexible circuit board are parallel with each other.

With the above configuration, due to the terminal-equipped flexible circuit board 12 in which the plurality of terminals 20 extend frontward from the end portion of the flexible circuit board 30 that extends in the front-rear direction, the yield of the flexible circuit board 30 can be improved.

Also, the connector-equipped flexible circuit board 10 according to the present embodiment is provided with the above-described terminal-equipped flexible circuit board 12 and the connector 11 that has cavities 13 that are arranged in the plurality of levels and house the plurality of terminals 20.

According to the present embodiment, due to the plurality of terminals 20 being respectively housed in the cavities 13 of the connector 11, the connector 11 in which the plurality of terminals 20 are arranged in the plurality of levels can be arranged at the end portion of the flexible circuit board 30. In this manner, the connector 11 can be made narrow in width.

Second Embodiment

Figure 11:
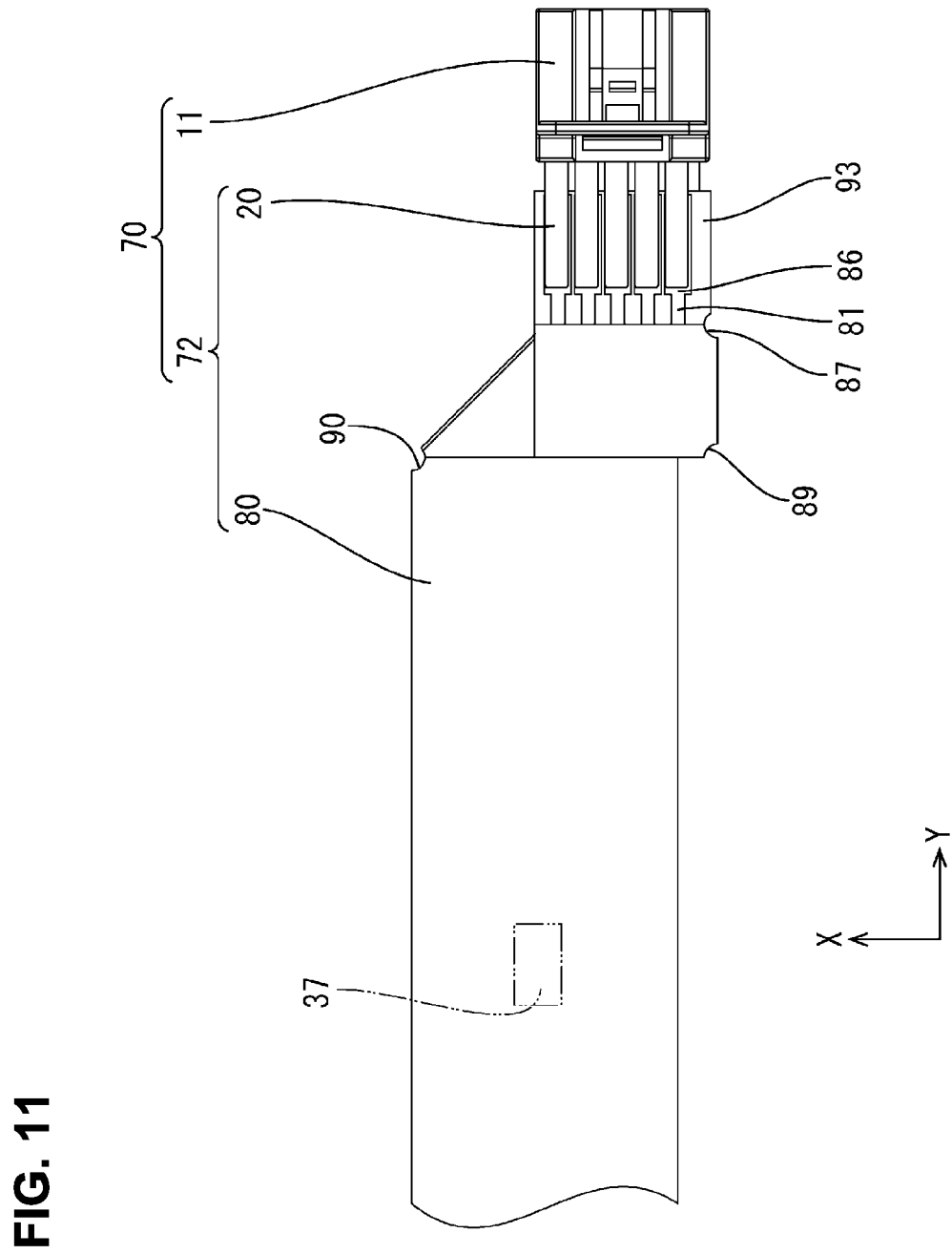
FIG. 11 is a plan view showing a connector-equipped flexible circuit board according to a second embodiment.

Next, a second embodiment of the present disclosure will be described with reference to FIGS. 11 to 18. As shown in FIG. 11, in a connector-equipped flexible circuit board 70 according to the present embodiment, the connector 11 is connected to the front end portion of the terminal-equipped flexible circuit board 72.

Figure 12:
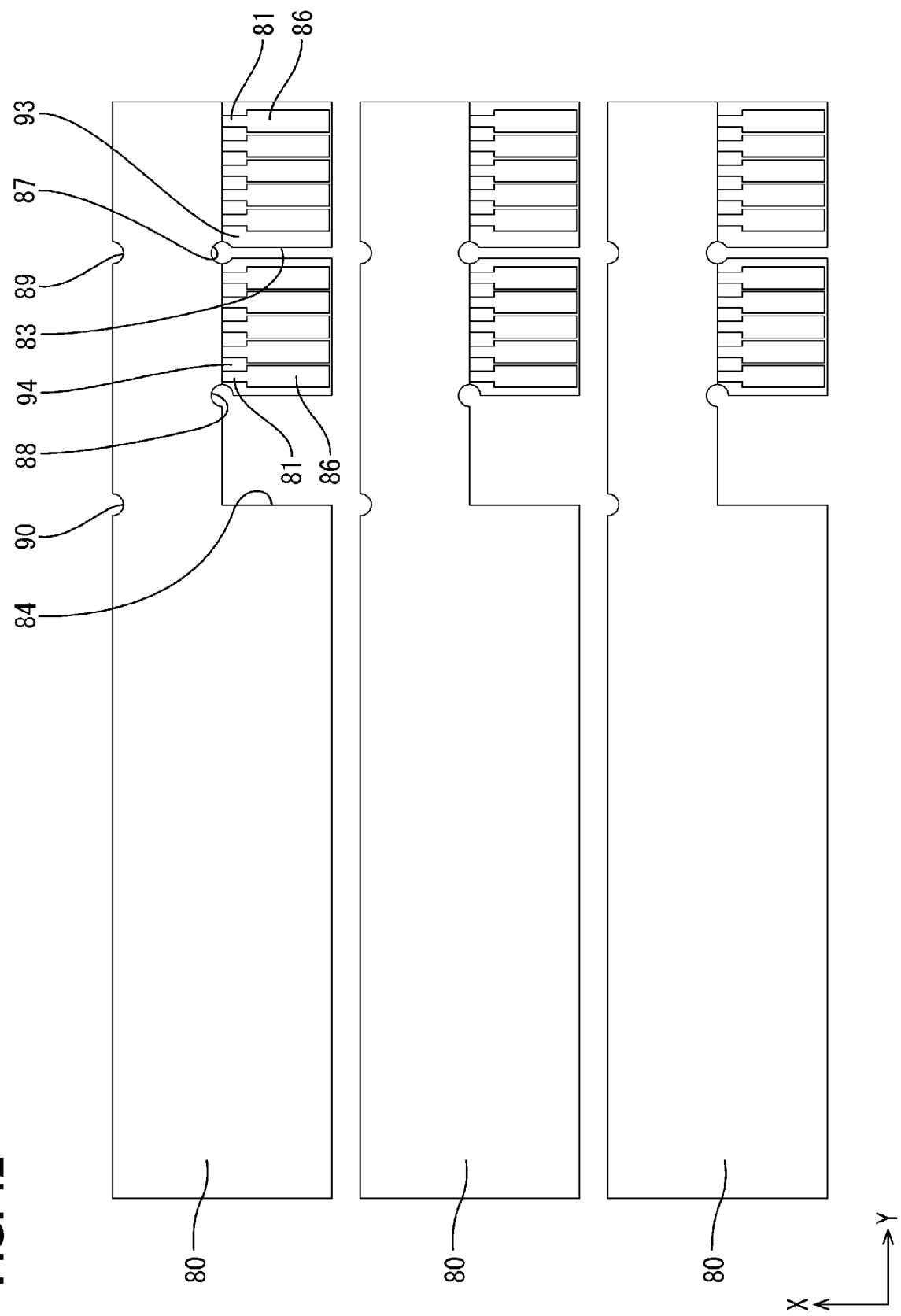
FIG. 12 is a plan view showing the flexible circuit board.

As shown in FIG. 12, a first slit 83 that extends leftward from the right side edge of the flexible circuit board 80 is formed at a position of a flexible circuit board 80 that is slightly rearward of the front end portion. The first slit 83 extends toward the vicinity of the central position of the flexible circuit board 80 in the left-right direction.

Further, a second slit 84 that extends leftward from the right side edge of the flexible circuit board 80 is formed at a position of the flexible circuit board 80 that is rearward of the first slit 83. The second slit 84 extends toward the vicinity of the central position of the flexible circuit board 80 in the left-right direction. The length dimensions of the first slit 83 and the second slit 84 in the left-right direction are the same. The width dimension of the second slit 84 in the front-rear direction is larger than the width dimension of the first slit 83.

A first right recessed portion 87 that has a substantially circular shape as seen from above is formed in the left end portion of the first slit 83 of the flexible circuit board 80. Also, in the flexible circuit board 80, a second right recessed portion 88 is formed at the front left corner of the second slit 84. The second right recessed portion 88 is shaped as a circle that is missing its diagonally rear right quarter.

A first left recessed portion 89 is formed at a position leftward of the first right recessed portion 87 at the left side edge of the flexible circuit board 80. The first left recessed portion 89 is formed in a semicircular shape as seen from above. A second left recessed portion 90 is formed at a position rearward of the first left recessed portion 89 at the left side edge of the flexible circuit board 80. The second left recessed portion 90 is formed at a position leftward of the rear edge portion of the second slit 84. The second left recessed portion 90 is formed in a semicircular shape as seen from above.

A region of the flexible circuit board 80 between the front end edge and the first slit 83 is a front connecting piece portion 93 to which the terminals 20 are connected. A region of the flexible circuit board 80 between the first slit 83 and the second slit 84 is a rear connecting piece portion 94 to which the terminals 20 are connected. The width dimensions in the front-rear direction of the front connecting piece portion 93 and the rear connecting piece portion 94 are the same.

On the upper surface of the front connecting piece portion 93, five lands 86 are formed at intervals in the front-rear direction. On the upper surface of the rear connecting piece portion 94, the other five lands 86 are also formed at intervals in the front-rear direction. The lands 86 are formed in a rectangular shape that is elongated in the left-right direction. The left end portions of the lands 86 are connected to the conductive paths 81.

As shown in FIG. 12, the front side connecting piece portion 93 and the rear side connecting piece portion 94 are formed by providing the first slit 83 and the second slit 84 in the right side edge of the flexible circuit board 80, and therefore the right end edge of the front connecting piece portion 93 and the right end edge of the rear connecting piece portion 94 do not protrude rightward with respect to the right side edge of the flexible circuit board 80.

Figure 13:
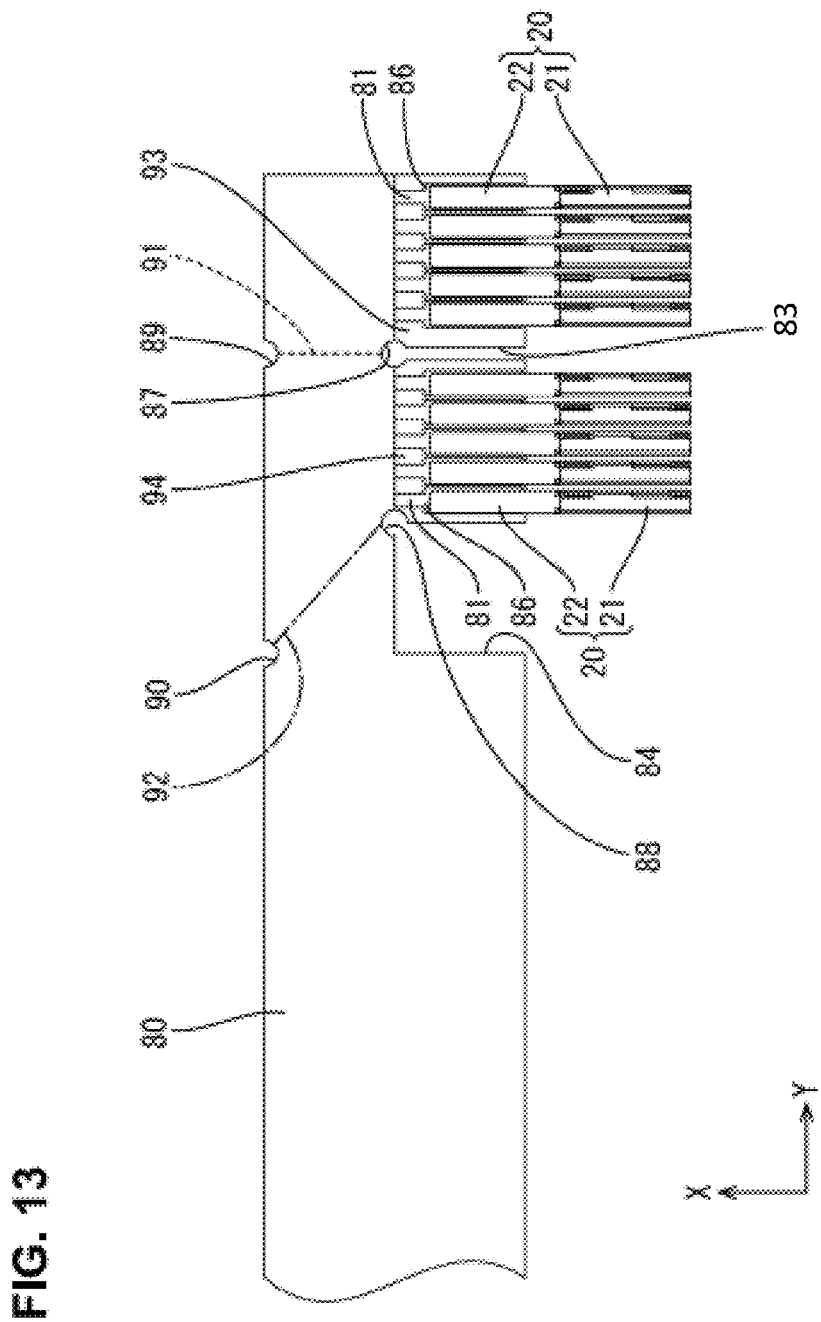
FIG. 13 is a plan view showing a state in which the terminals are connected to the flexible circuit board.
Figure 14:
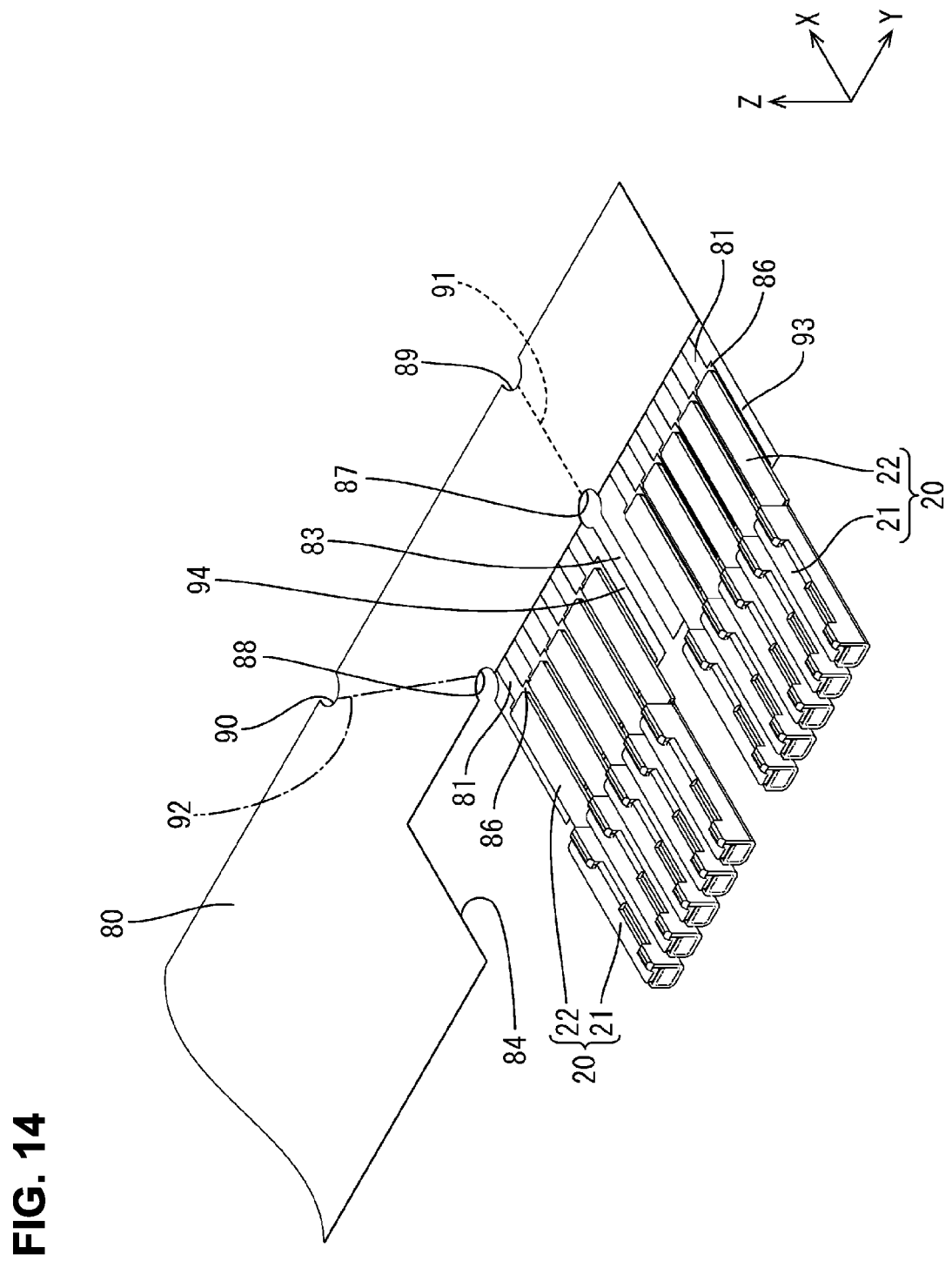
FIG. 14 is a perspective view showing a state in which the terminals are connected to the flexible circuit board.

As shown in FIGS. 13 and 14, due to the conductive path connection portions 22 of the terminals 20 being joined to the respective lands 86, the terminal connection portions 21 of the terminals 20 extend rightward (an example of the extending direction) from the right side edge of the flexible circuit board 80.

Folding Structure

FIGS. 13 and 14 show the flexible circuit board 80 to which the terminals 20 are connected, in the state before the flexible circuit board 80 is folded.

The flexible circuit board 80 is provided with a mountain fold line 91 that extends from the first right recessed portion 87 to the first left recessed portion 89 and a valley fold line 92 that extends from the second right recessed portion 88 to the second left recessed portion 90. The first right recessed portion 87, the second right recessed portion 88, the first left recessed portion 89, and the second left recessed portion 90 facilitate folding of the flexible circuit board 80 along the mountain fold line 91 and the valley fold line 92.

Figure 15:
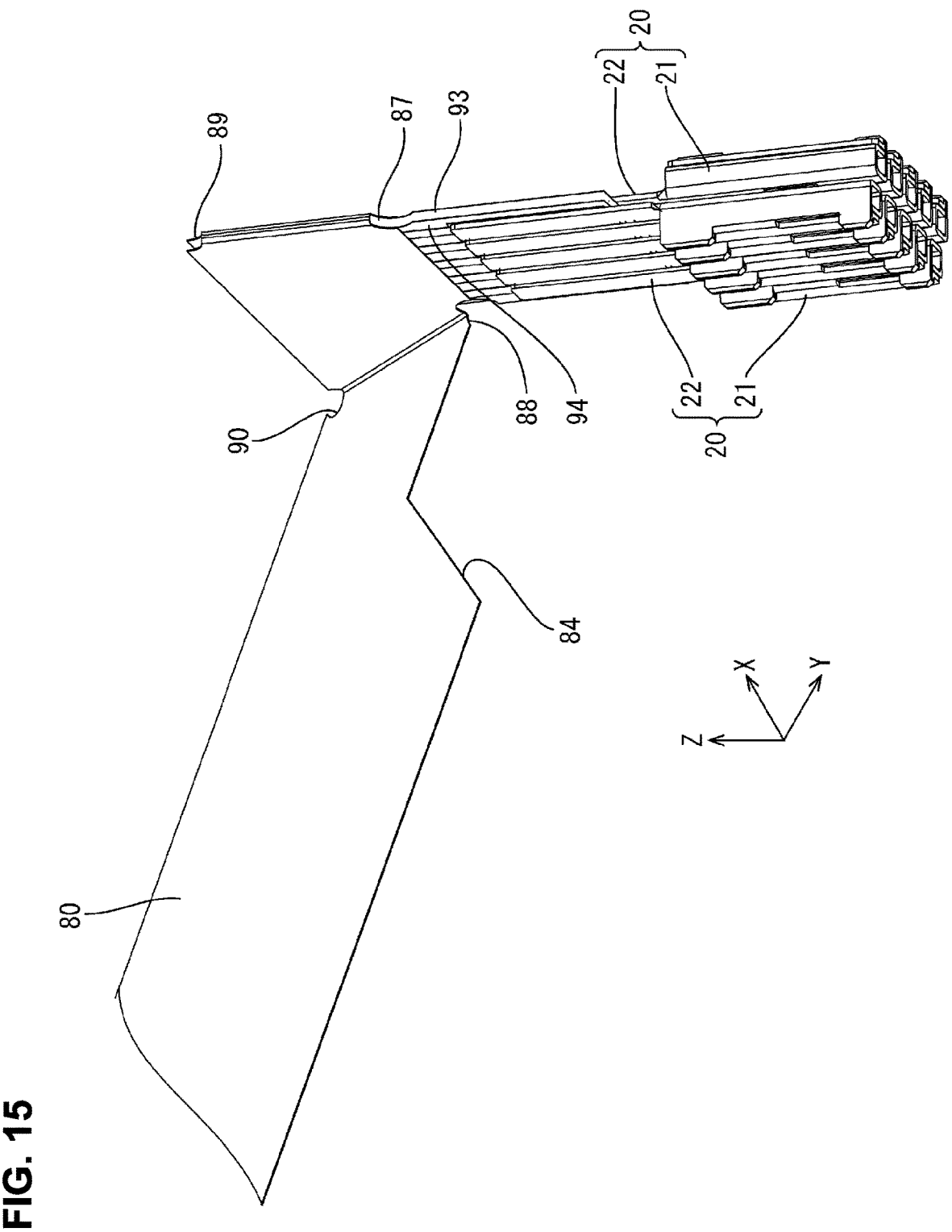
FIG. 15 is a perspective view showing a state in which the flexible circuit board is being folded along a valley fold line after being folded along a mountain fold line.

FIG. 15 shows a step in which the flexible circuit board 80 that has been mountain-folded along the mountain fold line 91 is being valley-folded along the valley fold line 92. Due to the flexible circuit board 80 being mountain-folded along the mountain fold line 91, the front connecting piece portion 93 and the rear connecting piece portion 94 overlap with each other. The terminal connection portions 21 of the terminals 20 connected to the front connecting piece portion 93 and the terminal connection portions 21 of the terminals 20 connected to the rear connecting piece portion 94 extend in the same direction.

Figure 16:
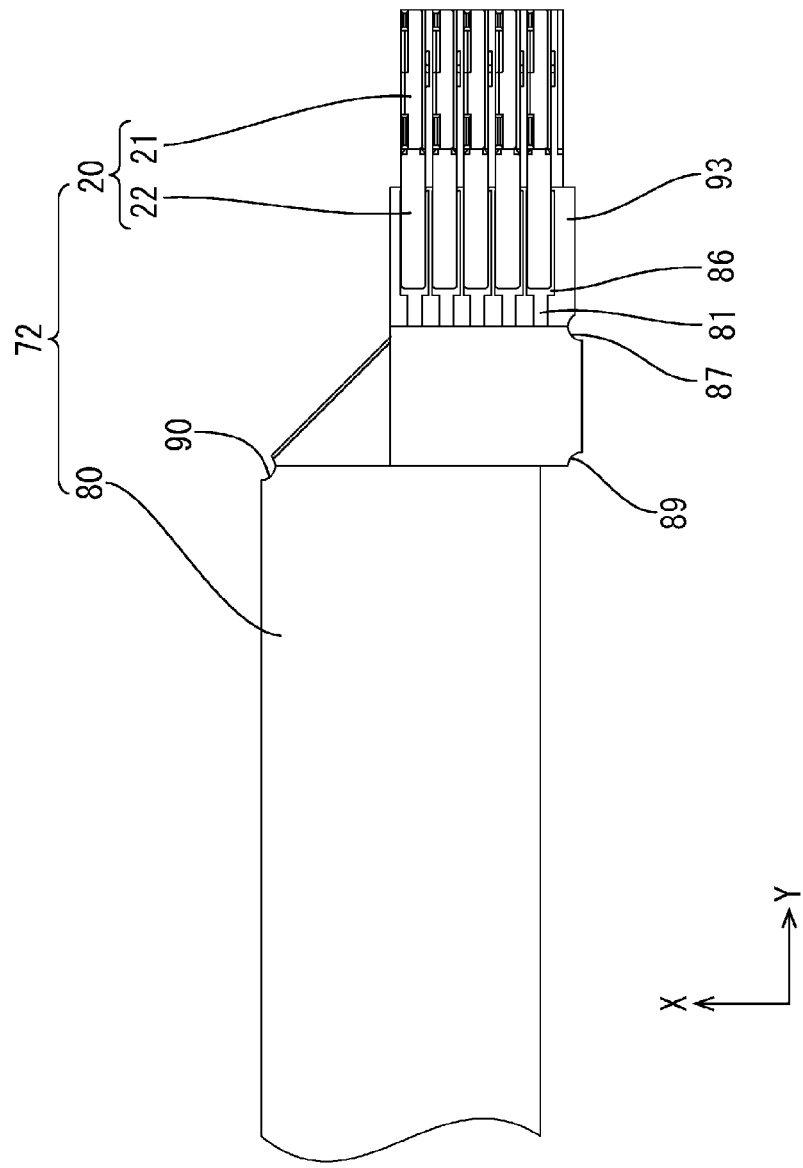
FIG. 16 is a plan view showing a state in which the flexible circuit board is folded along the valley fold line.
Figure 17:
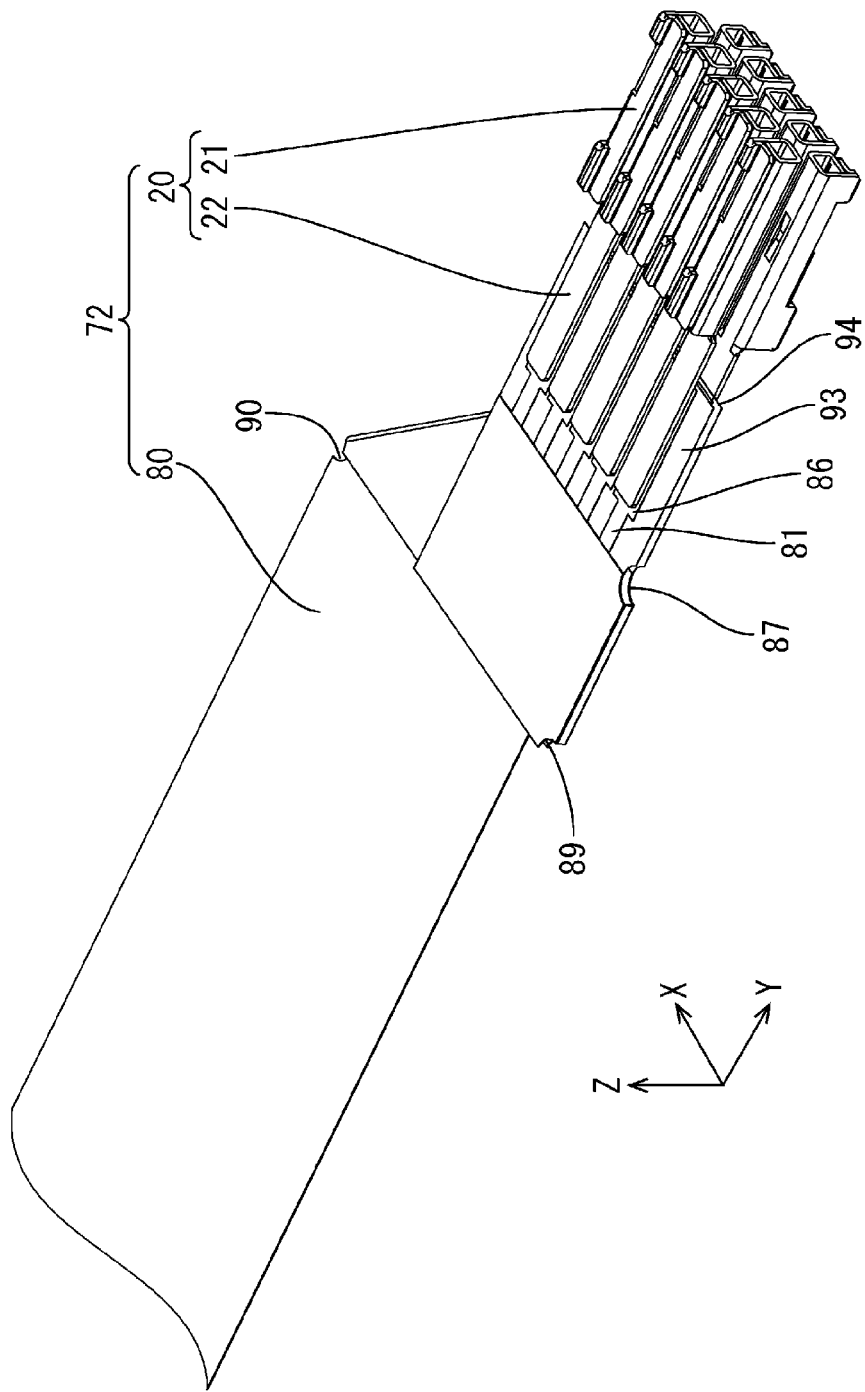
FIG. 17 is a perspective view showing a state in which the flexible circuit board is folded along the valley fold line.

FIGS. 16 and 17 show a state in which the flexible circuit board 80 has been valley-folded along the valley fold line 92. In this state, the front connecting piece portion 93 and the rear connecting piece portion 94 overlap with the upper surface of the flexible circuit board 80 while overlapping with each other in the up-down direction. In this state, the terminal connection portions 21 of the terminals 20 connected to the front connecting piece portion 93 and the terminal connection portions 21 of the terminals 20 connected to the rear connecting piece portion 94 extend frontward (an example of an extending direction).

Since the configuration other than the above is substantially the same as the first embodiment, identical members are given identical reference signs and redundant description is omitted.

Manufacturing Steps of Embodiment

Next, an example of manufacturing steps of the connector-equipped flexible circuit board of the present embodiment will be described. Note that the manufacturing steps of the present embodiment are not limited to the description below. First, the terminals 20 are joined to the lands 86 of the flexible circuit board 80 in a flat state shown in FIG. 12. The terminal connection portions 21 of the terminals 20 are respectively joined to the lands 86 through reflow soldering (see FIGS. 13 and 14). Next, as shown in FIGS. 15, 16, and 17, after the flexible circuit board 80 is mountain-folded along the mountain fold line 91, the flexible circuit board 80 is valley-folded along the valley fold line 92. In this manner, the terminal-equipped flexible circuit board 72 is completed.

Figure 18:
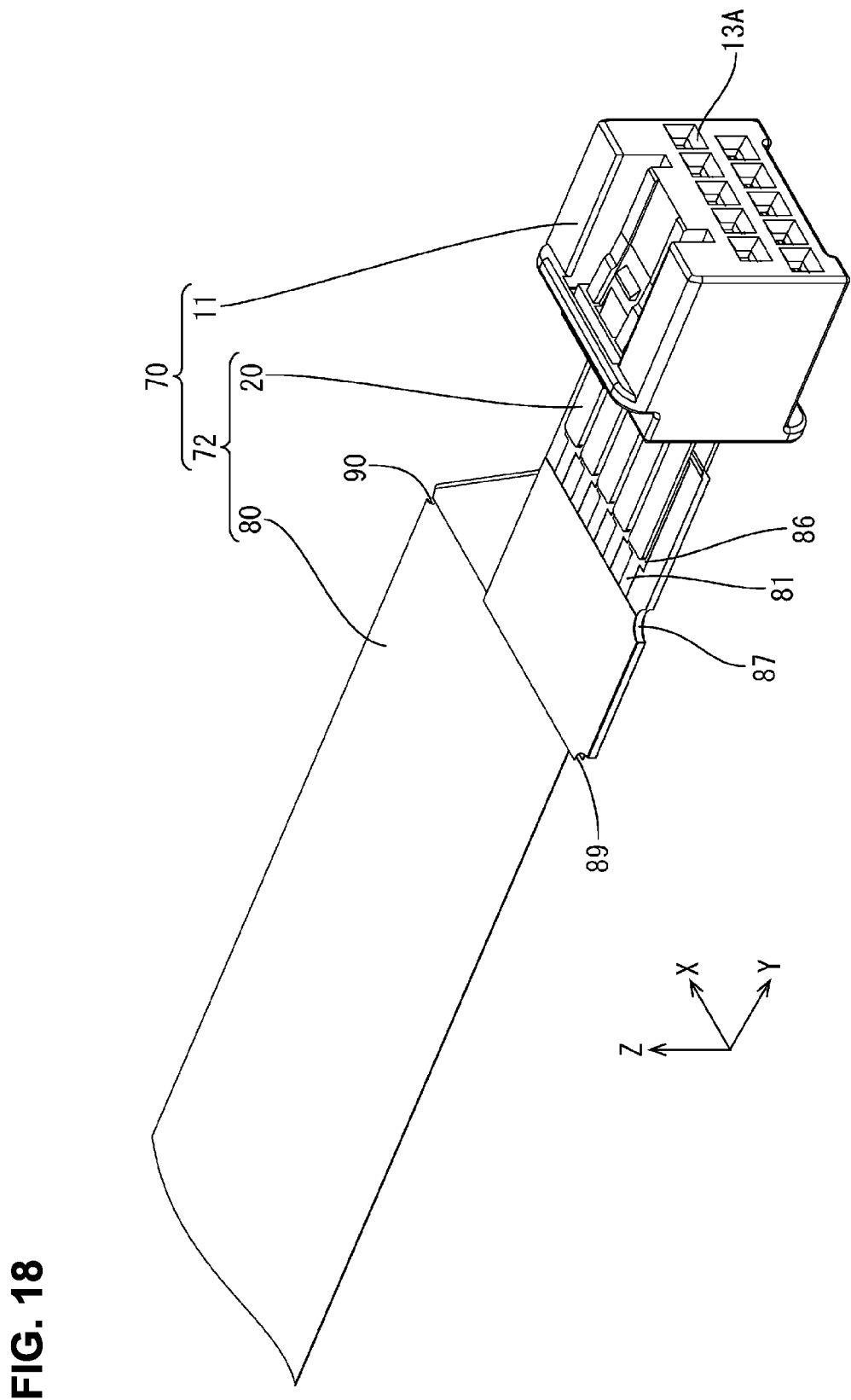
FIG. 18 is a perspective view showing a state in which terminal connection portions of the terminals are housed in the cavities of the connector.

Next, the terminal connection portions 21 of the terminals 20 are respectively inserted into the cavities 13 of the connector 11 from the rear side. In this manner, as shown in FIG. 18, the connector-equipped flexible circuit board 70 is completed.

Operation and Effects of Embodiment

Next, operation and effects of the present embodiment will be described.

According to the present embodiment, the plurality of terminals 20 are arranged side by side at the right side edge along the longitudinal direction (front-rear direction) of the flexible circuit board 80, the first slit 83 that extends leftward (an example of the extending direction) from the right side edge is formed at the right side edge of the flexible circuit board 80, and the flexible circuit board 80 is folded at the position corresponding to the first slit 83.

The plurality of terminals 20 arranged at the right side edge of the flexible circuit board 80 can form the plurality of levels for each region divided by the first slit 83 due to the flexible circuit board 80 being folded at the position corresponding to the first slit 83. In this manner, the plurality of terminals 20 can be easily arranged in the plurality of levels. In the present embodiment, the plurality of terminals 20 are vertically arranged in the two levels. If the number of the mountain fold lines and the valley fold lines is increased, the connecting piece portions to which the terminals 20 are connected are vertically stacked in three or more levels, and thus the plurality of terminals 20 can be arranged in any number of levels that is three or more.

As shown in FIG. 12, the flexible circuit board 80 according to the present embodiment does not branch into the comb-like shape protruding in the left-right direction. Accordingly, the flexible circuit board 80 according to the present embodiment does not have a portion protruding in the left-right direction. In this manner, the plurality of terminals 20 can be arranged in a plurality of levels without the flexible circuit board 30 protruding in the left-right direction, and thus the yield of the flexible circuit board 80 can be improved in the case where a plurality of flexible circuit boards 80 are cut out from a single base material.

Other Embodiments (1) In the above-described embodiment, so-called female-type terminals 20 were shown as an example, but there is no limitation to this, and the terminals 20 may also be of a male type, or round terminals.

(2) In the above embodiment, the conductive path connection portions 22 of the terminals 20 are joined to the lands 36 and 86 through reflow soldering, but there is no limitation to this, and the conductive path connection portions 22 may be joined through welding, brazing, or the like.

(3) In the above embodiment, the cavities 13 of the connector 11 form the two vertical levels, but there is no limitation to this, and the cavities 13 may form three or more levels.

(4) In the above embodiment, the flexible circuit boards 30 and 80 are flexible printed circuit boards, but there is no limitation to this, and the flexible circuit boards 30 and 80 may also be flexible flat cables (FFC).

(5) A configuration is also possible in which the electronic component 37 is not mounted on the flexible circuit board 30.

(6) The longitudinal direction of the flexible circuit board and the extending direction of the terminal need not necessarily be parallel with each other in the state where the flexible circuit board is folded.

LIST OF REFERENCE NUMERALS 10, 70 Connector-equipped flexible circuit board
11 Connector
12, 72 Terminal-equipped flexible circuit board
13 Cavity
13A Insertion hole
15 Partner terminal
20 Terminal
21 Terminal connection portion
22 Conductive path connection portion
23 Elastic Piece
30, 80 Flexible circuit board
31 Conductive path
36, 86 Land
37 Electric component
40 Through hole
41 Left recessed portion
42 Right recessed portion
51 First mountain fold line
52 Second mountain fold line
53 Third mountain fold line
61 First valley fold line
62 Second valley fold line
81 Conductive path
83 First slit
84 Second slit
87 First right recessed portion
88 Second right recessed portion
89 First left recessed portion
90 Second left recessed portion
91 Mountain fold line
92 Valley fold line
93 Front connecting piece portion
94 Rear connecting piece portion

The invention claimed is:

1. A terminal-equipped flexible circuit board provided with a flexible circuit board that is flexible and a plurality of terminals,
wherein the flexible circuit board extends in a longitudinal direction, the flexible circuit board includes a plurality of conductive paths that are formed on an upper or lower surface of the flexible circuit board,
the plurality of terminals each include a conductive path connection portion that is connected to a conductive path among the plurality of conductive paths and a terminal connection portion that extends in an extending direction from the conductive path connection portion and is connected to a partner terminal,
the plurality of terminals are arranged on the flexible circuit board in a state in which the longitudinal direction of the flexible circuit board intersects the extending direction of the plurality of terminals, the plurality of terminals are arranged side by side at both side edges along the longitudinal direction of the flexible circuit board,
the flexible circuit board includes:
a first mountain fold line that extends from a front end portion of the flexible circuit board to a position rearward of the plurality of terminals in the longitudinal direction, at a central position in a direction orthogonal to the longitudinal direction, the upper surface being folded into a protruding shape along the first mountain fold line;
a first valley fold line that extends in the direction orthogonal to the longitudinal direction at a position rearward of a rear end portion of the first mountain fold line, the upper surface being folded into a recessed shape along the first valley fold line;
a second mountain fold line and a third mountain fold line that respectively extend from the rear end portion of the first mountain fold line to intersections of both side edges of the flexible circuit board and the first valley fold line, and
a second valley fold line that extends from the rear end portion of the first mountain fold line to one side edge of the flexible circuit board in the direction orthogonal to the longitudinal direction, and
the plurality of terminals are arranged in a plurality of levels in a state in which the flexible circuit board is folded along the first mountain fold line, the second mountain fold line, the third mountain fold line, the first valley fold line, and the second valley fold line.

2. The terminal-equipped flexible circuit board according to claim 1,
wherein a through hole that extends through the flexible circuit board in the up-down direction is formed in the rear end portion of the first mountain fold line in the flexible circuit board.

3. The terminal-equipped flexible circuit board according to claim 1,
wherein the extending direction of the plurality of terminals and the longitudinal direction of the flexible circuit board are parallel with each other in a state in which the flexible circuit board is folded.

4. A connector equipped flexible circuit board comprising:
the terminal-equipped flexible circuit board according to claim 1, and
a connector housing including a plurality of cavities that are arranged in a plurality of levels and house the plurality of terminals.

5. A terminal-equipped flexible circuit board provided with a flexible circuit board that is flexible and a plurality of terminals,
wherein the flexible circuit board extends in a longitudinal direction, the flexible circuit board includes a plurality of conductive paths that are formed on an upper or lower surface of the flexible circuit board,
the plurality of terminals each include a conductive path connection portion that is connected to a conductive path among the plurality of conductive paths and a terminal connection portion that extends in an extending direction from the conductive path connection portion and is connected to a partner terminal,
the plurality of terminals are arranged on the flexible circuit board in a state in which the longitudinal direction of the flexible circuit board intersects the extending direction of the plurality of terminals, the plurality of terminals are arranged side by side at one side edge along the longitudinal direction of the flexible circuit board,
the flexible circuit board includes:
a first slit that extends from the one side edge of the flexible circuit board in a direction orthogonal to the longitudinal direction, at a position rearward of a front end portion of the flexible circuit board in the longitudinal direction;
a second slit that extends from the one side edge of the flexible circuit board in the direction orthogonal to the longitudinal direction, in a position rearward of the first slit, a width dimension of the second slit in the longitudinal direction being greater than that of the first slit;

a mountain fold line that extends from an end portion of the first slit toward another side edge of the flexible circuit board in the direction orthogonal to the longitudinal direction, and the upper surface being folded in a protruding shape along the mountain fold line; and a valley fold line that extends from a front end portion of the second slit to a position on the other side edge of the flexible circuit board that corresponds to a rear end portion of the second slit, the upper surface being folded in a recessed shape along the valley fold line, and the plurality of terminals are arranged in a plurality of levels in a state in which the flexible circuit board is folded along the mountain fold line and the valley fold line.

* * * * *